US009747392B2

United States Patent
Pitzer et al.

(10) Patent No.: US 9,747,392 B2
(45) Date of Patent: Aug. 29, 2017

(54) SYSTEM AND METHOD FOR GENERATION OF A ROOM MODEL

(71) Applicant: Robert Bosch GmbH, Stuttgart (DE)

(72) Inventors: Benjamin Pitzer, Menlo Park, CA (US); Matthias Roland, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 615 days.

(21) Appl. No.: 14/210,715

(22) Filed: Mar. 14, 2014

(65) Prior Publication Data

US 2014/0267717 A1 Sep. 18, 2014

Related U.S. Application Data

(60) Provisional application No. 61/788,890, filed on Mar. 15, 2013.

(51) Int. Cl.
*H04N 7/18* (2006.01)
*G06F 17/50* (2006.01)
(Continued)

(52) U.S. Cl.
CPC ......... *G06F 17/5004* (2013.01); *G01C 15/00* (2013.01); *G01C 15/002* (2013.01);
(Continued)

(58) Field of Classification Search
CPC .. G01C 15/00; G06F 17/5004; G06K 9/00476
USPC .......... 348/143, 135, 139, 140, 61; 345/660; 356/11, 8, 3
See application file for complete search history.

(56) References Cited

U.S. PATENT DOCUMENTS

| 5,771,342 | A | * | 6/1998 | Todd | ................. G06T 17/00 345/660 |
| 6,420,698 | B1 | | 7/2002 | Dimsdale | |

(Continued)

FOREIGN PATENT DOCUMENTS

| JP | 2009258823 A | 11/2009 |
| WO | 2012013388 A1 | 2/2012 |
| WO | 2012081995 A1 | 6/2012 |

OTHER PUBLICATIONS

International Search Report and Written Opinion corresponding to PCT Application No. PCT/US2014/027372, mailed Jul. 29, 2014 (14 pages).

(Continued)

*Primary Examiner* — Paulos M Natnael
*Assistant Examiner* — Jean W Desir
(74) *Attorney, Agent, or Firm* — Maginot Moore & Beck LLP

(57) ABSTRACT

A method for generating a floor plan of a room uses a mobile electronic device and a range finder to produce approximate and modified floor plans. The method includes receiving a plurality of strokes corresponding to walls in a room with a gesture input device, generating an approximate floor plan of the room based on the strokes, generating an approximate floor plan of the room with reference to the plurality of strokes, receiving an input gesture corresponding to one wall in the approximate floor plan of the room for measurement, receiving measurement data from a range finder corresponding to a dimension of the selected one wall, modifying the approximate floor plan with reference to the measurement data from the range finder, and generating with a display of the modified floor plan of the room.

18 Claims, 10 Drawing Sheets

(51) Int. Cl.
  *G06K 9/00* (2006.01)
  *G06K 9/20* (2006.01)
  *G01C 15/00* (2006.01)
  *G01S 7/481* (2006.01)
  *G01S 17/02* (2006.01)
  *G01S 17/08* (2006.01)
  *G01S 17/88* (2006.01)
  *G01S 17/89* (2006.01)

(52) U.S. Cl.
  CPC ............ *G01S 7/481* (2013.01); *G01S 17/023* (2013.01); *G01S 17/08* (2013.01); *G01S 17/88* (2013.01); *G01S 17/89* (2013.01); *G06K 9/00476* (2013.01); *G06K 9/2081* (2013.01)

(56) References Cited

U.S. PATENT DOCUMENTS

| | | |
|---|---|---|
| 7,398,481 B2 | 7/2008 | Kraus et al. |
| 2008/0065346 A1 | 3/2008 | Shkipin |
| 2012/0105825 A1 | 5/2012 | Gogolla et al. |

OTHER PUBLICATIONS

Do, Ellen Yi-Luen, "Sketch that Scene for Me: Creating Virtual Worlds by Freehand Drawing", eCAADe 2000 "Promise and Reality", Proceedings of the 18th conference on Education in Computer Aided Architectural Design in Europe, Jun. 22-24, 2000, pp. 265-268 (4 pages).

Kim, Young Min et al., "Interactive Acquisition of Residential Floor Plans", 2012 IEEE International Conference on Robotics and Automation, RiverCentre, Saint Paul, Minnesota, USA, May 14-18, 2012, pp. 3055-3062 (8 pages).

Weber, Markus et al., "a.SCAtch—A Sketch-Based Retrieval for Architectural Floor Plans", IEEE, 2010 12th International Conference on Frontiers in Handwriting Recognition, Kolkata, India, Nov. 16-18, 2012, pp. 289-294 (6 pages).

Supplemental European Search Report corresponding to European Patent Application No. 14770606 (6 pages).

Donath et al., "Integrated architectural surveying and planning Methods and tools for recording and adjusting building survey data", Automation in Construction, Elsevier Science Publishers, Amsterdam, NL, vol. 16, No. 1, Jan. 1, 2007 (9 pages).

Petzold et al., "Planning-oriented building surveying Modules in the computer aided architectural planning process of existing buildings", Architectural Information Management, 19th eCAADe Conference Proceedings, Jan. 1, 2001 (6 pages).

Sankar et al., "Capturing Indoor Scenes with Smartphones", UIST 2012, Oct. 7, 2012 (9 pages).

Rosser et al., "Modelling of Building Interiors with Mobile Phone Sensor Data", ISPRS International Journal of Geo-Information, vol. 4, No. 2, Jun. 12, 2015 (24 pages).

\* cited by examiner

SYSTEM AND METHOD FOR GENERATION OF A ROOM MODEL

CLAIM OF PRIORITY

This application claims priority to U.S. Provisional Application No. 61/788,890, which is entitled "System And Method For Generation Of A Room Model," and was filed on Mar. 15, 2013, the entire contents of which are hereby incorporated by reference herein.

TECHNICAL FIELD

This disclosure relates generally to the fields of architecture and construction, and more specifically, to generation of two and three dimensional models of one or more rooms.

BACKGROUND

Precise measurements of rooms in a home or other building are important for a wide range of construction, repair, and remodeling projects. In many cases, the exact dimensions of a room are unknown and blue prints or other architectural drawings are unavailable for use during the project. Instead, measurements for the room are obtained using, for example, a tape measure or commercially available laser range finders. For larger rooms and rooms with irregular shapes, a precise measurement of the dimensions for the room often requires two or more people to hold the tape measure. While laser range finders simplify the process of measuring dimensions of walls and other fixtures in a room, each measurement from the laser range finder only corresponds to a single dimension between two locations in the room. Additional manual or computer processing is still required to generate a full two-dimensional or three-dimensional model of the room from the individual measurements of a tape measure, laser range finder, or other measuring device.

In some commercial projects, laser detection and ranging (LIDAR) devices are used to generate detailed scans of a room from a fixed location using one or more lasers that scan the room in an automated manner. The expense and complexity of such systems, however, often preclude their use in smaller construction projects and "do it yourself" remodeling and construction projects. With the growing popularity of smartphones, tablets, and other computing devices that include cameras, software applications have been developed that attempt to produce models of a room using multiple photographs or video of the interior of the room. While sophisticated image processing software in mobile electronic devices enables generation of an approximate floor plan of a room, models that are generated from the photographs and video often generate measurements with insufficient accuracy to be used for planning a construction project. Additionally, many construction projects need information about multiple rooms and existing measurement techniques often require line of sight measurements that are blocked by the walls separating different rooms in building. What is needed, therefore, are improvements to systems and methods for producing accurate models of a room and multiple rooms in a building in an efficient and accurate manner.

SUMMARY

In one embodiment, a method for generating a model of a room has been developed. The method includes receiving with a gesture input device in the mobile electronic device a plurality of strokes corresponding to walls in a room, generating with a controller in the mobile electronic device an approximate floor plan of the room with reference to the plurality of strokes, receiving with the gesture input device an input gesture that selects one wall in the approximate floor plan for measurement, receiving with the controller measurement data from a range finder corresponding to a dimension of the selected one wall, modifying with the controller the approximate floor plan with reference to the measurement data from the range finder, and generating with a display in the mobile electronic device a graphical display of the modified floor plan of the room.

In another embodiment, a system for generating a model of a room has been developed. The system includes a range finder and a mobile electronic device operatively connected to the range finder. The mobile electronic device includes a display device, a gesture input device configured to receive input gestures from an operator, and a controller operatively connected to the display device, the gesture input device, and the range finder. The controller is configured to receive with the gesture input device a plurality of strokes corresponding to walls in a room, generate an approximate floor plan of the room from the plurality of strokes, receive with the gesture input device an input gesture that selects one wall in the approximate floor plan of the room for measurement, receive measurement data from the range finder corresponding to a dimension of the one wall, modify the approximate floor plan of the room with reference to the measurement data from the range finder, and display the modified floor plan of the room with the display device.

In another embodiment, a mounting that holds a mobile electronic device and a range finder has been developed. The mounting includes a support member configured to engage a mobile electronic device and a range finder, the support member being configured to hold the mobile electronic device and the range finder at a predetermined orientation that enables an optical detector in the range finder to identify a range to an object in field of view of a camera in the mobile electronic device.

DETAILED DESCRIPTION

For the purposes of promoting an understanding of the principles of the embodiments described herein, reference is now be made to the drawings and descriptions in the following written specification. No limitation to the scope of the subject matter is intended by the references. This patent also includes any alterations and modifications to the illustrated embodiments and includes further applications of the principles of the described embodiments as would normally occur to one skilled in the art to which this document pertains.

As used herein, the term "mobile electronic device" refers to any portable computing device that includes a digital controller, display devices, touchscreen or other gesture input devices, and cameras. Examples of mobile electronic devices include smartphones, tablets, handheld computing devices, wearable computing devices, and the like. Some mobile device embodiments include inertial sensors. Examples of inertial sensors that are incorporated with mobile electronic devices include gyroscopes and accelerometers. As used herein, the term "range finder" refers to a device that identifies a distance between the device and a remote object, such as a distance between the range finder device and a wall in a room. Embodiments of the range finder include laser range finders, ultrasonic range finders, stereoscopic range finders, and other commercially available range finding devices.

As used herein, a reference to the terms "gesture" and "input gesture" are used interchangeably and refer to any hand movement from an operator that a mobile electronic device recognizes as a valid form of input to control the operation of the mobile electronic device. The term "gesture input device" refers to any input device that enables a mobile electronic device to receive the gesture input from an operator. Mobile electronic devices include gesture input devices such as touch input devices including touchscreens, three-dimensional gesture input devices that are implemented with one or more cameras, and other suitable sensors that detect input gestures. Gestures include, but are not limited to, tap gestures using one or more fingers that optionally correspond with a graphical element on a display device, and stroke gestures. As used herein, the terms "stroke" and "drawing stroke" are used interchangeably and refer to a type of gesture that forms a straight or curved line for input to the mobile electronic device. As described below, a mobile electronic device receives input stroke gestures that correspond to the approximate arrangements of walls in a room.

Figure 1:
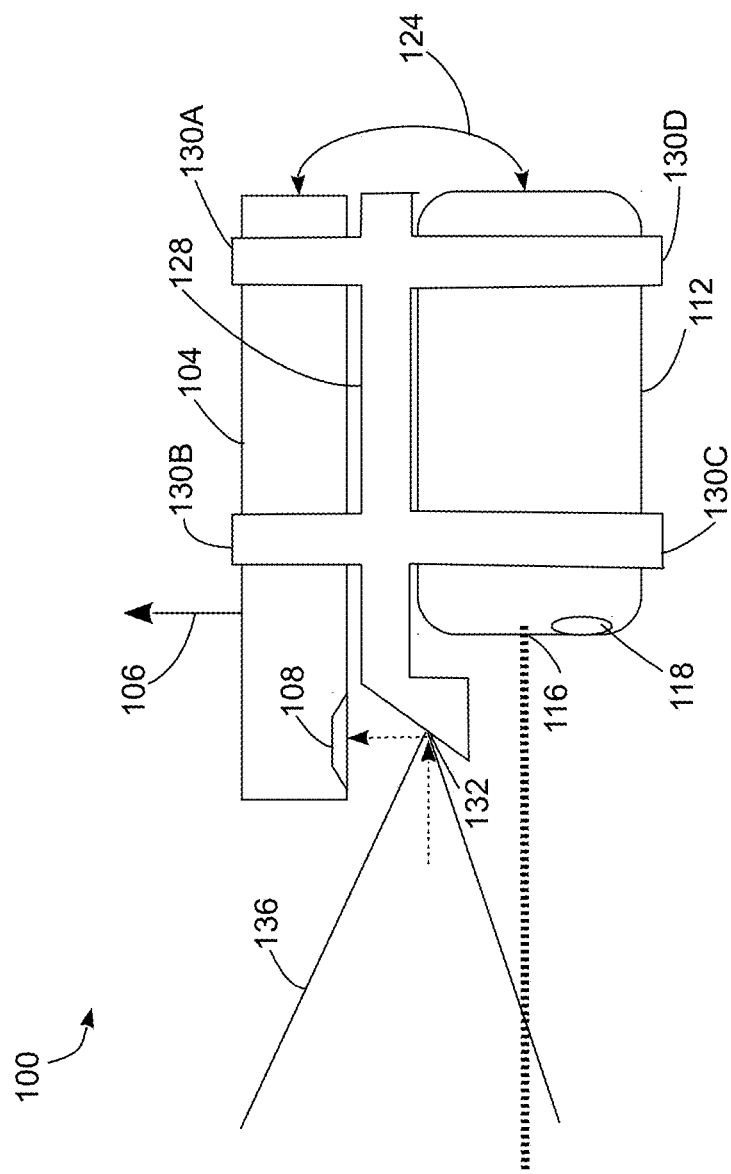
FIG. 1 is a profile view of a support member that holds a mobile electronic device in a predetermined relative alignment with a range finding device for generating measurements of a MOM.

FIG. 1 depicts a system 100 that generates graphical models of rooms including two-dimensional floor plan models and three-dimensional models of the rooms. The system 100 includes a mobile electronic device 104, a range finder 112, and a support member 128 that holds the mobile electronic device 104 and range finder in a fixed orientation relative to one another. The mobile electronic device 104 includes a touchscreen display on the top of the mobile electronic device 104 that faces upward as indicated by the arrow 106. The mobile electronic device 104 also includes a camera 108. The mobile electronic device 104 also includes one or more inertial sensors that generate signals corresponding to an angle of orientation or rotational motion (angular acceleration), respectively, of the mobile electronic device 104.

In the illustrative example of FIG. 1, the range finder 112 includes a laser emitter 116 that directs a laser light toward a surface in a room, such as a wall, floor, or ceiling, and an optical detector 118 that detects the reflected laser light. The range finder 112 times the emission and detection of the reflected light to identify the range to the surface using techniques that are known to the art. In the system 100, the mobile electronic device 104 is connected to the range finder 112 through a wired data connection 124. The wired data connection 124 is, for example, a universal serial bus (USB) connection. In another embodiment, the mobile electronic device 104 and range finder 112 are connected using wireless communication devices such as Bluetooth devices. In one configuration, the mobile electronic device 104 executes a software application that generates a user interface with a control to activate the range finder 112 and to retrieve range data from the range finder 112. In another embodiment, an operator activates the range finder 112 using controls that are included with the range finder 112, and the mobile electronic device 104 receives the range data from the range finder 112.

In FIG. 1, the support member 128 includes one or more adjustable arms, such as the arms 130A-130D, which secure the mobile electronic device 104 and range finder 112 in place. In one embodiment, the support arms 130A and 130B engage the mobile electronic device 104 from the sides but do not interfere with viewing or touch interaction with the touchscreen on top of the mobile electronic device 104. The arms 130C and 130D engage the range finder 112 without interfering with the laser emitter 116 and optical detector 118. The support member 128 orients the mobile electronic device 104 so that the camera 108 is substantially perpendicular to the orientation of the laser emitter 116 in the range finder 112. The support member 128 also includes a mirror 132 that is positioned in front of the camera 108 and oriented at an angle to reflect light from a scene in front of the range finder to the camera 108. In one embodiment, the mirror 132 is oriented at a fixed angle with respect to the camera 108 to provide view of a fixed region in front of the range finder 112. In another embodiment, the mirror 132 is placed on a rotatable mount that enables an operator to move the mirror in a range of angles, such as a range of 20° to 60° with respect to the camera 108. The moveable mirror 132 enables the camera 108 to take multiple photographs for a "vertical image scan" of walls or other features in the room. The mirror 132 provides an effective field of view 136 for the camera 108 that includes the surfaces for which the range finder 112 generates range data. For example, if the range finder 112 is used to find the range to a wall in a room, the mirror 132 enables the mobile electronic device 104 and camera 108 to take photographs or record video of the wall while the range finder 112 is generating the range measurements.

During operation of the system 100, the mobile electronic device 104 generates a user interface using the display as viewed from the top of the mobile electronic device 104 in direction 106. An operator inputs strokes using, for example, a finger or a stylus, to form a sketch of a room that is to be measured. The mobile electronic device 104 generates an approximate floor plan drawing for the room from the strokes in the sketch, and then prompts the operator to generate precise measurements for dimensions in the room using the range finder 112. The operator moves the system 100 to locations in the room as prompted by the user interface on the mobile electronic device 104 to generate the precise measurements. The mobile electronic device 104 then uses the precise measurement data to generate a precise floor plan display for the room. The precise measurements for the dimensions of the room optionally include identification of non-perpendicular angles between walls in some room configurations. In one optional operating mode, the operator also generates a precise height measurement between a floor and a ceiling of the room to generate a three-dimensional model of the room. In another operating mode, the camera 108 generates photographs of walls and other objects in the room and the three-dimensional model includes textures corresponding to the photographs of the room. In another optional operating mode, the system 100 generates floor plans and three-dimensional models for multiple rooms in a building and the mobile electronic device 104 displays the floor plans and three-dimensional models for multiple rooms in the building. In another operating mode, the mobile electronic device 104 stores captured images of the room in association with the three-dimensional model for the room to present the measurement information on one or more photographs of the room. For example, the mobile electronic device 104 or another computing device presents a photograph of the room and an overlay display that marks one or more measured dimensions or angles between walls in the room. The measurements can be presented as text annotations on the photograph to provide information about the dimensions and angles within the room in the context of a photograph.

Figure 2:
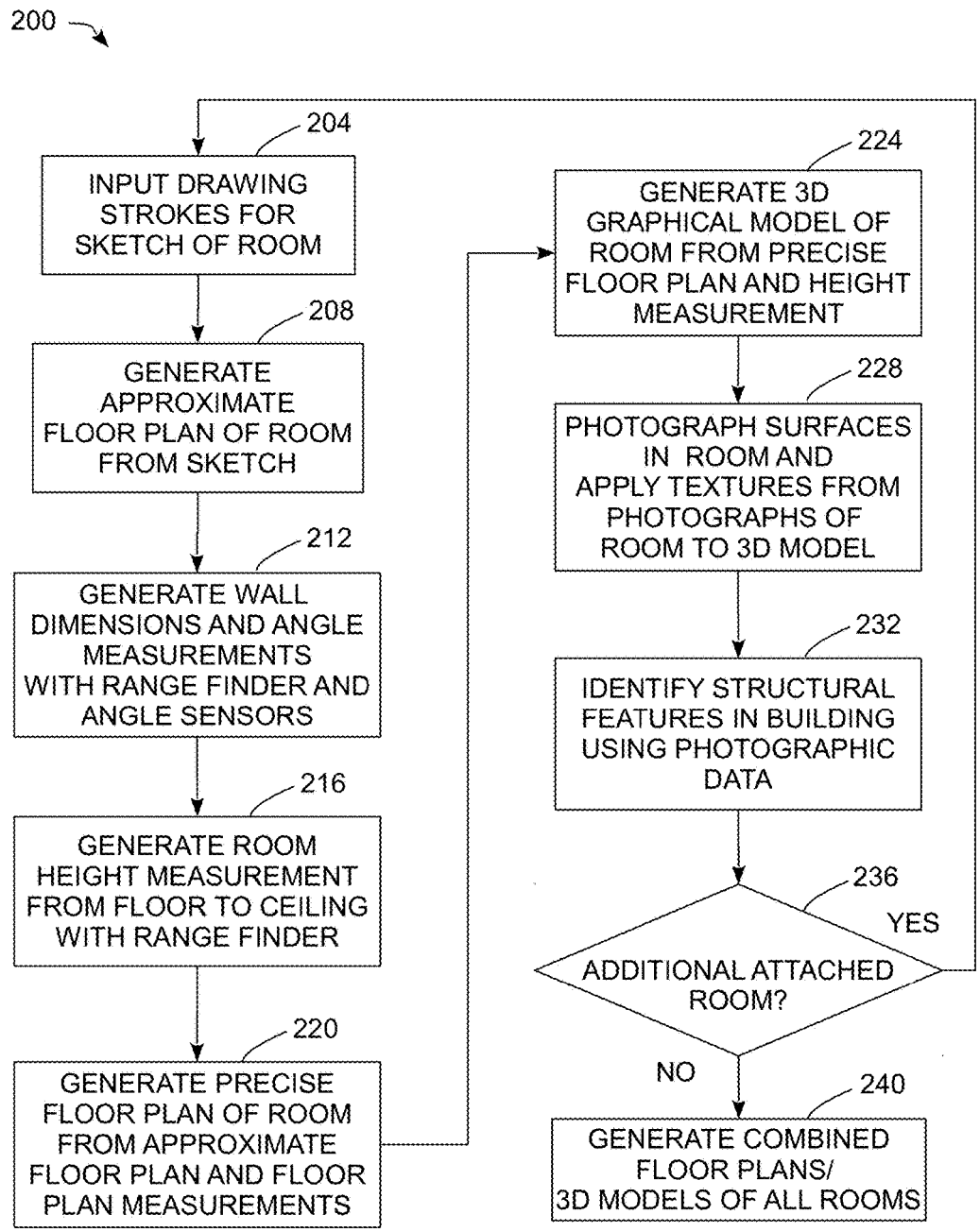
FIG. 2 is a block diagram of a process 200 for generating two-dimensional floor plan graphics and three-dimensional room model graphics for a room with a mobile electronic device and a range finding device.

FIG. 2 depicts a process 200 for generation of precise floor plans and three-dimensional models of rooms in a building using a mobile electronic device and a range finder. In the description below, a reference to the process 200 performing a function or action refers to functions or actions that are performed by one or more control devices, such as digital controllers in the mobile electronic device 104 and range finder 112, which execute stored program instructions to perform the function or action.

Figure 3:
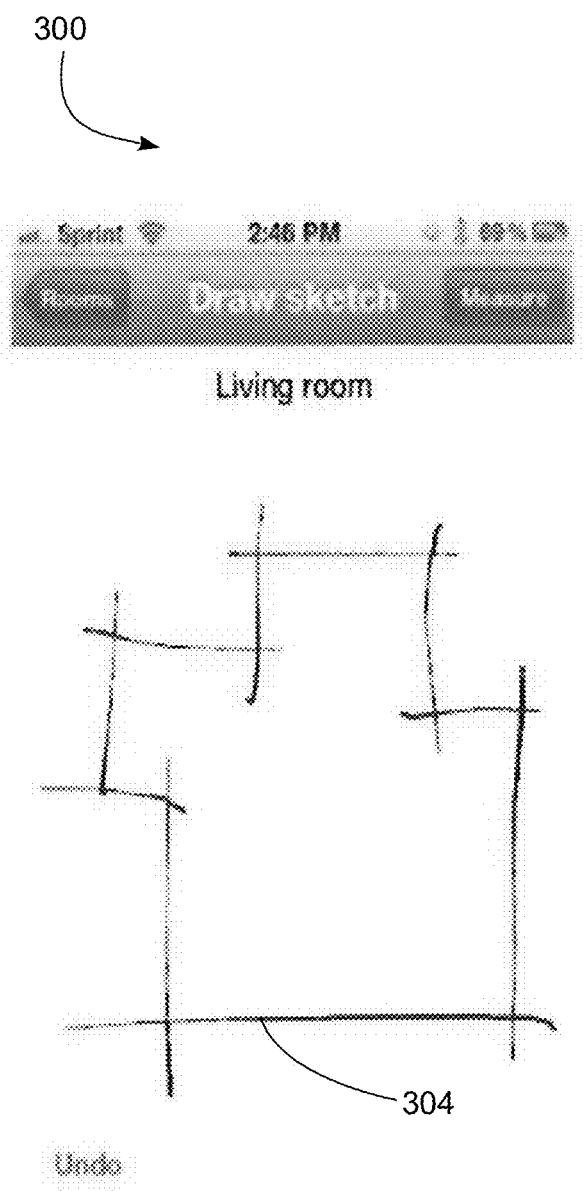
FIG. 3 is a graphical depiction of input strokes that are provided to a mobile electronic device to sketch of a floor plan of a room.

Process 200 begins as the mobile electronic device 104 generates a user interface to enable the operator to input drawing strokes that form an approximate sketch of the floor plan of a room (block 204). In one embodiment, the operator uses a finger or a stylus to enter drawing strokes on a touchscreen display that is integrated with the mobile electronic device 104. FIG. 3 depicts a user interface 300 that is generated using the mobile electronic device 104. The user interface 300 includes a region for entry of drawing strokes 304 that correspond to walls in a room. Each stroke corresponds to a wall in the room, and an intersection between two strokes corresponds to a corner between two or more walls. As used herein, the term "intersection" refers to a common coordinate on the user interface input where a first drawing stroke entry and a second drawing stroke entry both include the same coordinate, and consequently indicate that the walls corresponding to each stroke in the room. The user interface also includes a text entry interface for the operator to enter a label for the room. For example, in FIG. 3 the sketch in the user interface 300 is labeled "Living room."

Figure 4:
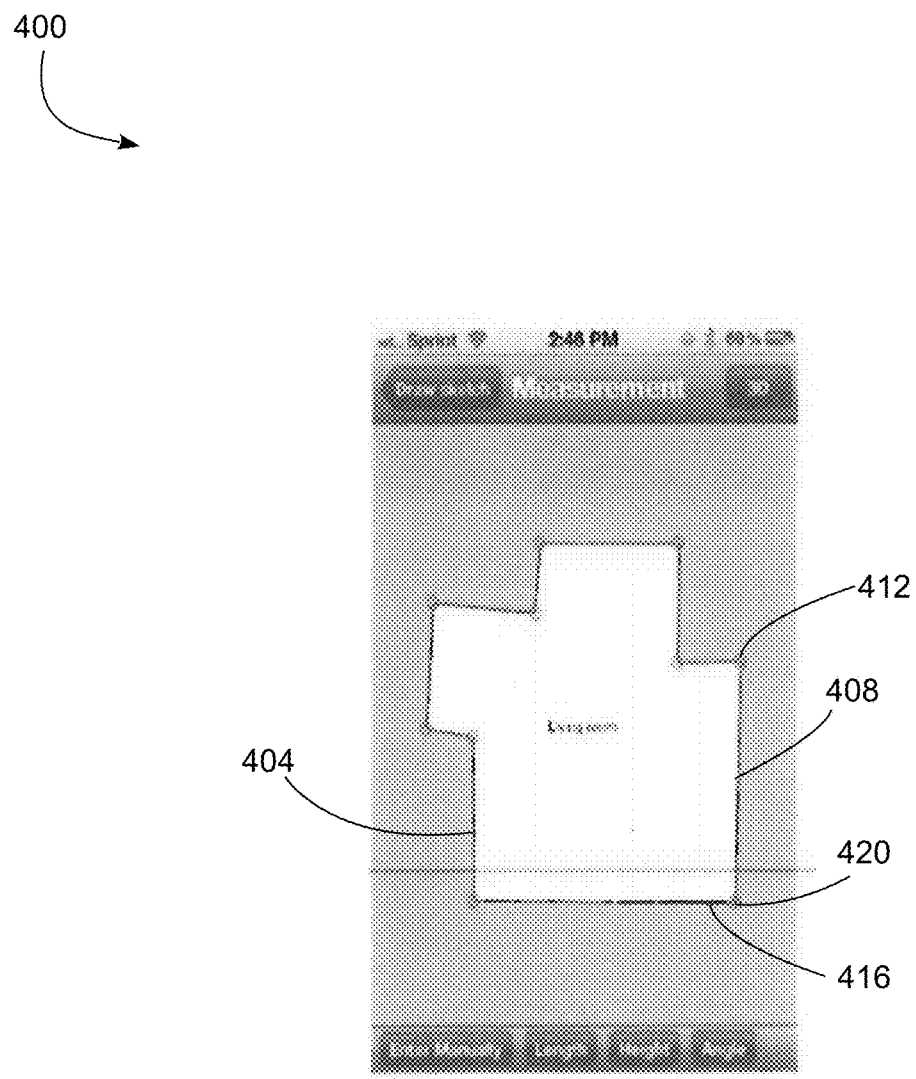
FIG. 4 is a graphical depiction of an approximate floor plan that a mobile electronic device generates from a user sketch.

Process 200 continues as the mobile electronic device 104 generates an approximate floor plan for the room using the strokes that are entered for the sketch (block 208). In one embodiment, the mobile electronic device 104 generates straight-line approximations for each stroke and joins the straight lines together to form a closed polygon that represents an approximate floor plan for the room. The sides of the polygon and relative angles of intersections between sides of the polygon are not necessarily to scale because the sketch is not necessarily to scale. FIG. 4 depicts a display 400 including an approximate floor plan 404 that is generated from the graphical depiction of the strokes 304 in FIG. 3.

After generation of the approximate floor plan, process 200 continues with generation of precise measurements for wall dimensions and angles in the room (block 212). The mobile electronic device generates an input user interface for the operator to select one of the walls in the approximate floor plan. For example, the user touches one of the walls depicted in the approximate floor plan 404 of FIG. 4. The operator then places the system 100 including the range finder 112 at one end of the selected wall and operates the range finder 112 to identify a range to another wall surface at the far end of the selected wall. For example, in FIG. 4, the operator selects wall 408 in the floor plan 404, locates the range finder 112 in the corner 412 pointing toward the wall 416, and operates the range finder 112 to identify a dimension of the wall 408. In one embodiment, the mobile electronic device 104 also generates a graphical depiction of a level while the operator measures dimensions in the room. The graphics for the level are generated based on the readings of inertial sensors, such as accelerometers and gyroscopes, in the mobile electronic device 104. The operator uses the output from the level to adjust the orientation of the phone and the range finder to ensure that the range finder is fully horizontal or vertical when measuring distances between features in the room to ensure that the range measurements are not inadvertently made along a diagonal line. In the system 100, the mobile electronic device 104 is configured to compensate for the dimensions of the devices in the system 100, including the dimensions of the mobile electronic device 104, range finder 112, and support member 128, to enable measurement of the wall dimensions with sufficient precision for a wide range of construction projects.

In addition to identifying dimensions for the walls in the room, the operator optionally measures or enters precise angles between walls. In one operating mode, the system 100 assigns a default angle of 90° between intersecting walls in a room since many rooms include perpendicularly aligned walls. For wall intersections that do not intersect at 90° angles, the mobile electronic device 104 generates a user interface that enables the operator to measure a precise wall angle using sensors in the mobile electronic device 104, or to enter the angle manually. For example, the operator selects an intersection 420 in the approximate floor plan 404, and subsequently moves the mobile electronic device from contact with a wall corresponding to the graphic 416 to contact with the wall corresponding to the graphic 408 through the angle between the two walls.

Figure 5A:
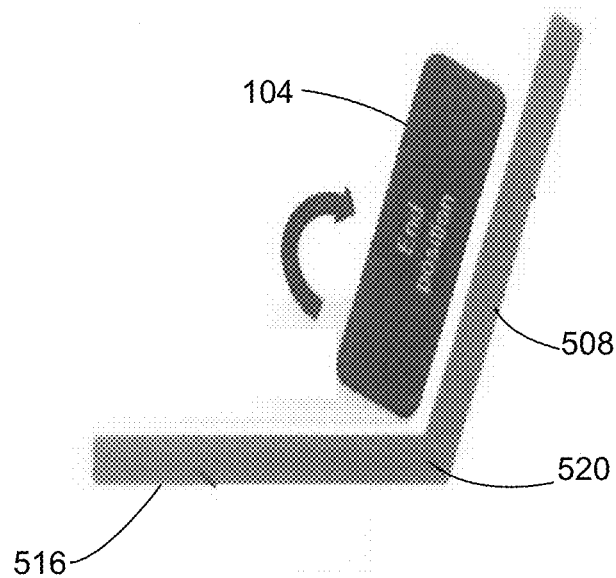
FIG. 5A is a plan view of a mobile electronic devices with an orientation sensor that is used to measure an angle between two walls in a room.
Figure 5B:
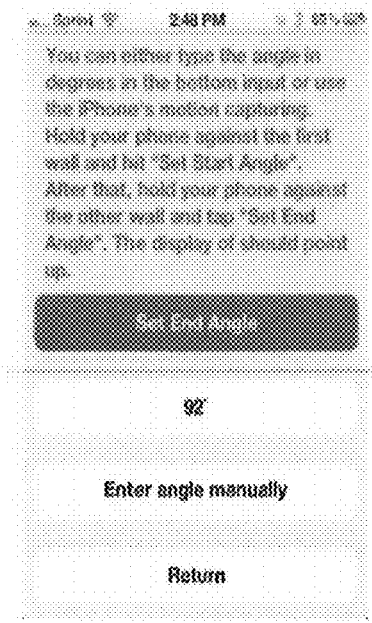
FIG. 5B is a graphical depiction of a user interface display that prompts a user to enter an angle between two walls in a room.

FIG. 5A depicts two walls 508 and 516 that intersect at location 520. The walls 508 and 516 correspond to the graphics for the walls 408 and 416, respectively, in the floor plan 404. The intersection 520 corresponds to the intersection 420 in the floor plan 404. As depicted in FIG. 5A, the operator places the mobile electronic device 104 in parallel with the wall 516 and rotates the mobile electronic device 104 through the angle at the intersection 520 to be parallel with the wall 508. One or more inertial sensors in the mobile electronic device 104 generate signals that identify the angle of rotation for the mobile electronic device 104 and the corresponding angle between the walls 516 and 508. In another embodiment, the operator measures the angle between the two walls using a conventional angle measurement method. As depicted in FIG. 5B, the operator enters the measured angle between the two walls. In some embodiments, the wall angle measurement defaults to generating a predetermined set of angles that are commonly found between walls in a room, including perpendicular angles and commonly seen non-perpendicular angles. Perpendicular angles can include 90, 180, and 270 degree angles. Examples of common non-perpendicular angles include, but are not limited to, 45, 135, 225, and 315 degree angles. In the embodiment of FIG. 5B, the operator can adjust the measured angle through the user interface to account for uncommon angles between walls in some rooms.

Referring again to FIG. 2, the process 200 optionally includes a measurement of a height of the ceiling of the room from the floor of the room (block 216). The system 100 identifies the floor to ceiling height for generation of three-dimensional models of the room, and the process 200 optionally omits the height measurement if the operator is only generating a two-dimensional floor plan of the room. For rooms with a uniform ceiling height from the floor, the system 100 generates a single height measurement using the range finder 112 placed on the floor and directed toward the ceiling. For rooms with angled ceilings, the operator uses the system 100 to generate multiple height measurements at different locations in the room to model the angle of the ceiling in the room.

Figure 6:
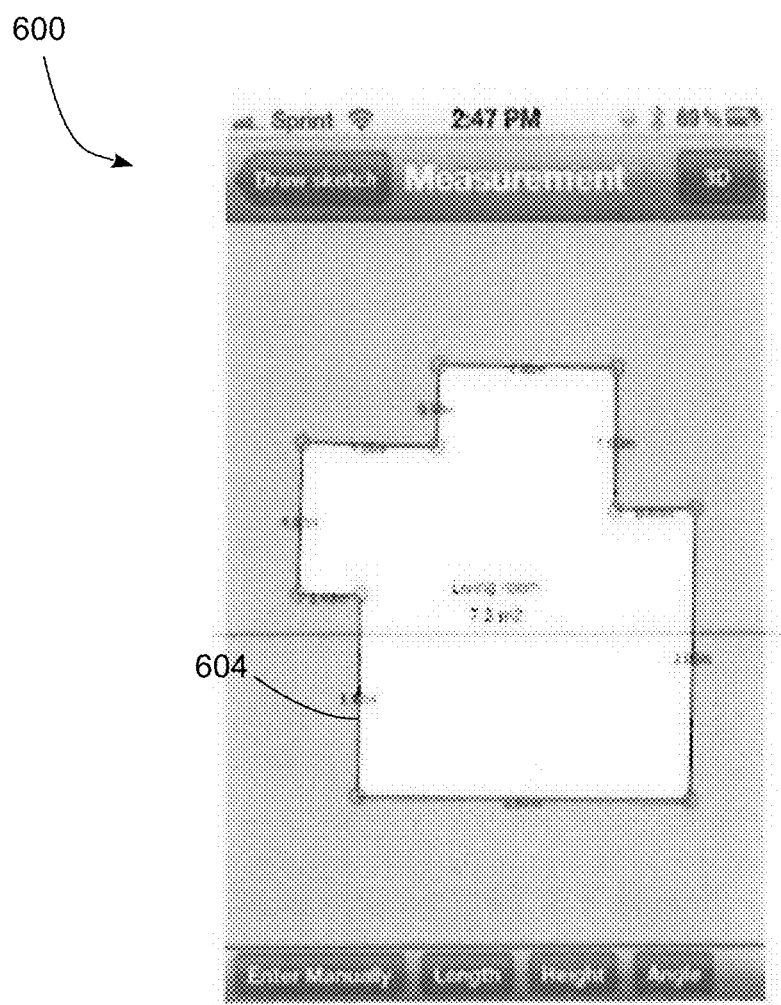
FIG. 6 is a graphical diagram of a precise floor plan of a room that is generated from an approximate floor plan and measurement data for the walls in the room.

Process 200 continues as the mobile electronic device 104 generates a display of a precise floor plan using the data corresponding to the approximate floor plan and the measurements of wall dimensions and wall angles (block 220). The mobile electronic device modifies the approximate floor plan using the measurement data from the range finder 112 and optional angle measurements for non-perpendicular walls to generate a precise floor plan for the room. FIG. 6 depicts a display 600 of a precise floor plan 604 that the mobile electronic device 104 generates from the approximate floor plan 404 and the measurement data. In the precise floor plan 604, each wall is labeled with the measured dimension and the relative sizes of each wall are displayed to scale with the corresponding dimensions. The walls in the floor plan also intersect each other at perpendicular angles or at measured angles between walls that do not meet at perpendicular angles. The mobile electronic device 104 optionally identifies other properties of the room, including the volume of the room, square footage of the room, and corresponding areas of windows and doors on the walls in the room using the data from the precise floor plan.

Figure 7:
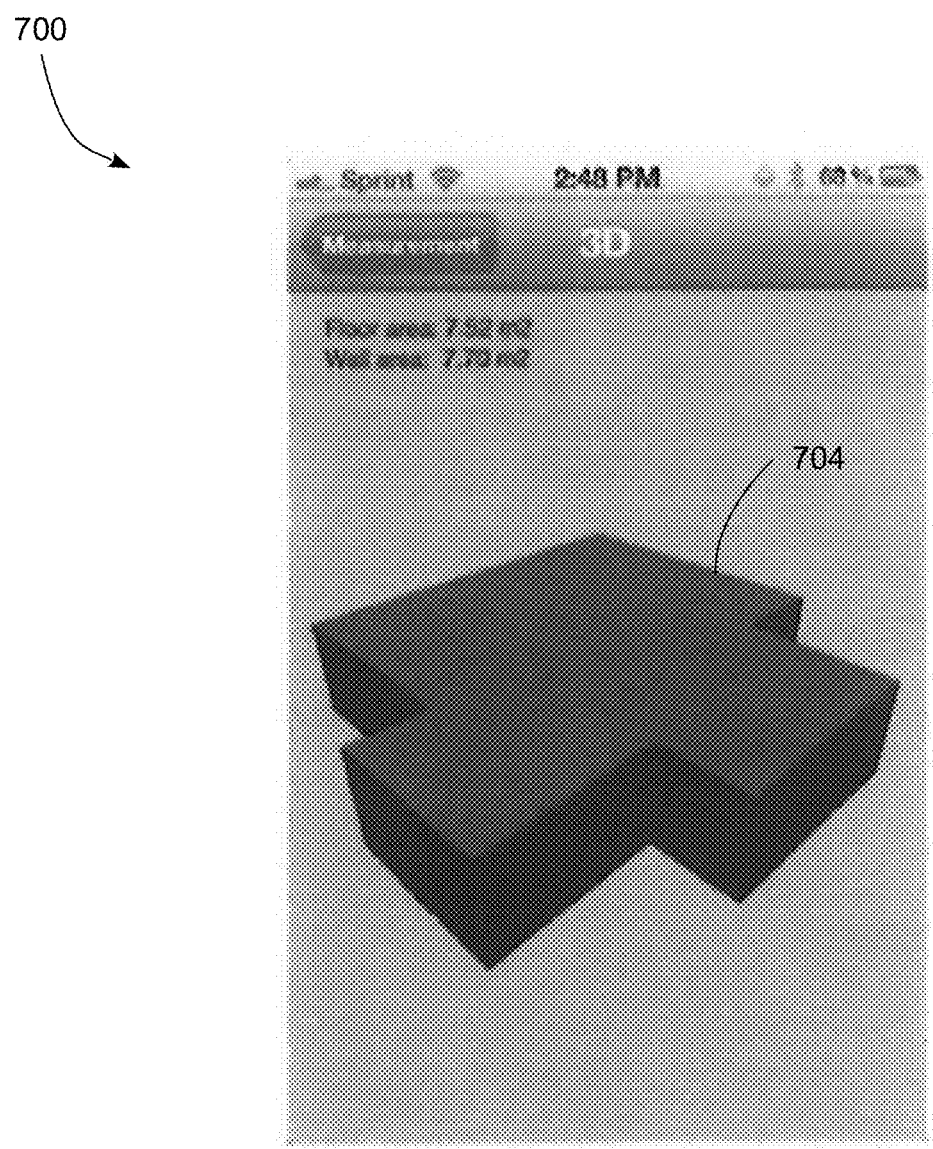
FIG. 7 is a graphical depiction of a three-dimensional model of a room that is generated from two-dimensional precise floor plan data and a measurement of the height of the room.

During process 200, the mobile electronic device 104 optionally generates a three-dimensional model of the room using the precise floor plan data and measurement of the ceiling height in the room (block 224). In one configuration, the mobile electronic device 104 models the three-dimensional room with three-dimensional polygons. The two-dimensional precise floor plan forms the base of the polygon model on a length and width plane, and the mobile electronic device 104 extends the base into a three-dimensional space along a height axis using the measured floor to ceiling height data to scale the size of the model accurately. FIG. 7 depicts a display 700 of a three-dimensional model 704 that is generated from the precise floor plan 604 of FIG. 6 and the height data generated by the range finder 112.

During process 200, the mobile electronic device 104 optionally generates photographs of the room and displays the three-dimensional model of the room with the photographs applied to the surfaces of walls as textures in the three-dimensional model (block 228). In one embodiment, the mobile electronic device 104 displays the two-dimensional floor plan of the room or three-dimensional model of the room. The operator selects the graphical depiction for each of the walls in the room, and operates the camera 108 to generate photographs corresponding to each wall. In the system 100, the mirror 132 in the support member 128 enables the operator to take photographs of the room concurrently with use of the range finder 112. The mobile electronic device 104 applies the photographs that are generated during operation of the range finder 112 to the corresponding wall surfaces in the three-dimensional model.

Figure 8:
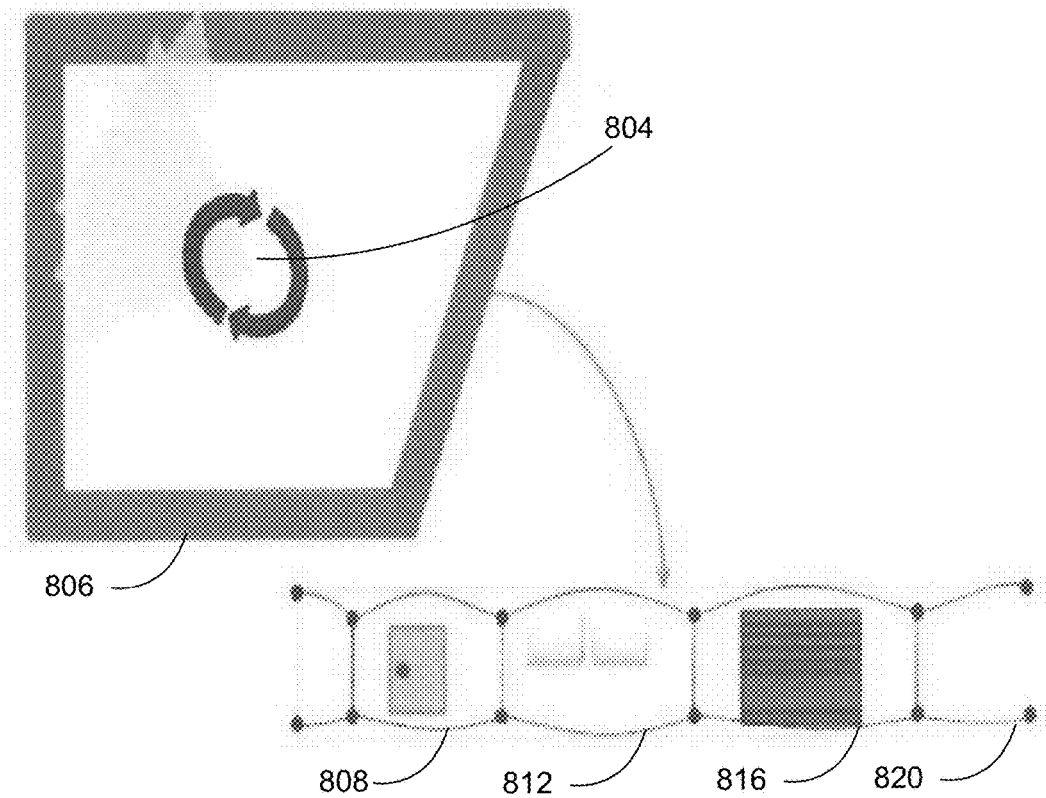
FIG. 8 is a diagram of a path of motion for a camera to generate photographic data of multiple walls in a room.
Figure 9:
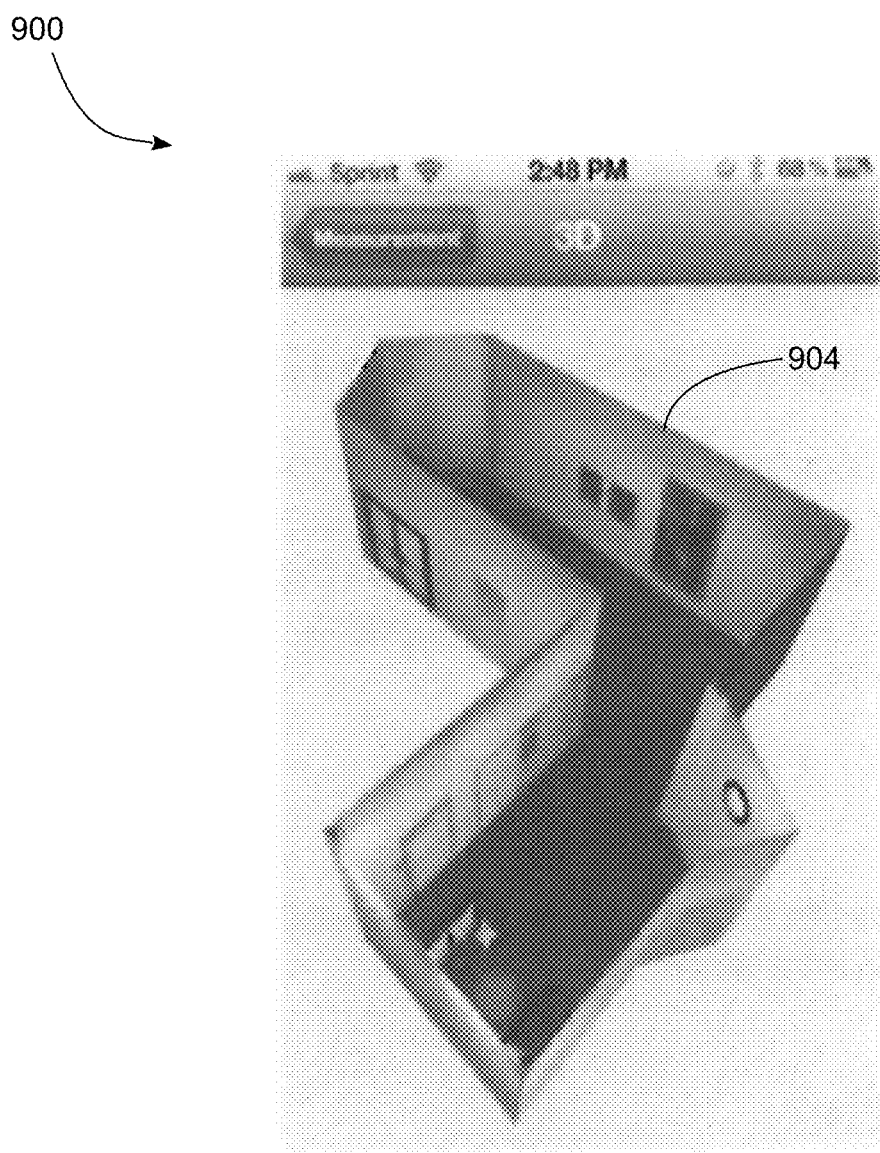
FIG. 9 is a graphical depiction of a three-dimensional model of a room including photographs of the walls in the room applied to surfaces of the three-dimensional model.

In another embodiment, the operator rotates the mobile electronic device 104 and camera 108 around a central location in the room to generate photographs of each wall in the room. As depicted in FIG. 8, the mobile electronic device 104 rotates in a central location 804 to photograph the walls in a room 806. As the operator rotates the system 100 in a 360° rotation in the room 806, the camera 108 generates photographs of the walls in the room, such as photographs 808, 812, 816, and 820 in FIG. 8. Software in the mobile electronic device 104 records the overlapping photographic data from the camera 108. The mobile electronic device 104 then uses computer vision techniques such as image stitching, image alignment and image blending to generate a panoramic image of the room, including the photographs 808-820, with reference to the recorded overlapping image sequence. In one embodiment, the operator manually identifies the walls that correspond to the photographs, while in another embodiment the computer vision software in the mobile electronic device 104 identifies the corners between walls and automatically identifies photographs that correspond to each wall. To generate a three-dimensional model of the room using the photographs, a graphical processing unit (GPU) in the mobile electronic device 104 applies the photographs to the walls in the three-dimensional model using graphical texturing techniques that are known to the art. FIG. 9 depicts a display 900 of a room model 904 that includes textures that are applied to the three-dimensional representations of walls in the room. The mobile electronic device 104 generates the textures from photographic image data produced using the camera 108 or digital image data from another camera that produces pictures of different walls in the room.

In addition to displaying a three-dimensional room model with the photographic texture data, the system 100 optionally identifies structural features in the building and the corresponding locations of the structural features using the photographic data (block 232). In one embodiment, the mobile electronic devices includes image processing software with machine vision and object recognition functionality that is configured to identify specific structural features in a building including doors, windows, power outlets, electrical switches, ceiling lights, HVAC ducts, heating radiators, sprinklers, and the like. The system 100 optionally displays the identified features and stores the identified features in a memory of the mobile electronic device 100.

Figures 10A, 10B:
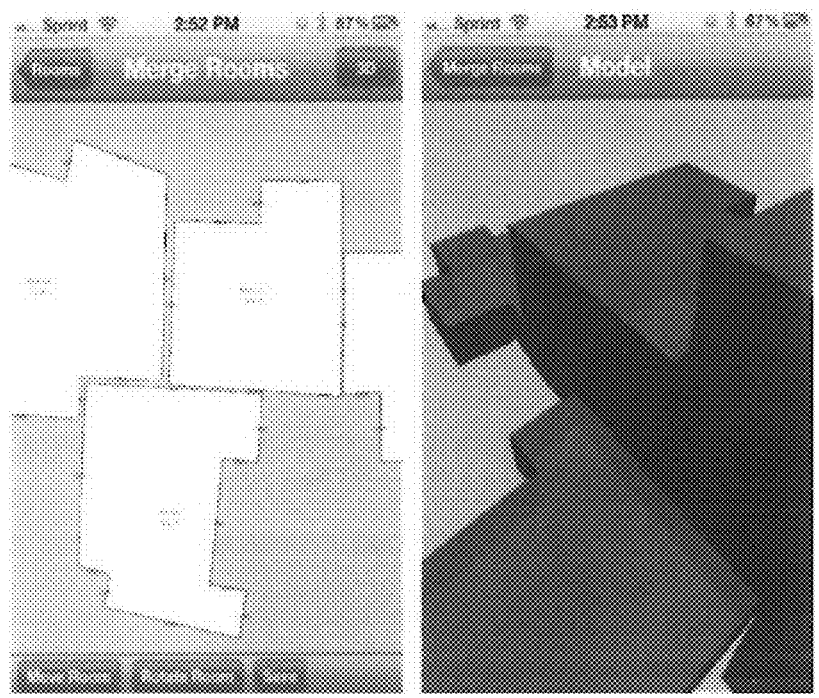
FIG. 10A is a graphical depiction of floor plans that are generated for multiple rooms in a building.
FIG. 10B is a graphical depiction of three-dimensional models of multiple rooms in a building.

Referring again to FIG. 2, the process 200 optionally continues for multiple rooms in a building (block 236). The system 100 performs the processing described above with reference to blocks 204-228 to generate floor plans and optionally three-dimensional models for multiple rooms. In some buildings, the rooms are connected to each other through entryways. Once the floor plan and model data are generated for each of the attached rooms (block 236), the system 100 optionally displays the floor plans or three-dimensional models for the multiple rooms as the rooms are arranged in a larger building (block 240). In one embodiment, the operator manually selects the floor plans of different rooms and arranges the floor plans next to each other along common boundaries and entryways. Using the touchscreen interface in the mobile electronic device 104, the operator moves and orients the floor plans for different rooms using one or more touch input gestures. The operator optionally enters the locations of doors and windows in the floor plan data in embodiments where the system 100 does not automatically identify the door and window features. In another embodiment, the mobile electronic device 104 identifies corresponding corners and structural features of the multiple floor plans and arranges the floor plans for the rooms automatically using, for example, a registration process that fits floor plans of different rooms together based on common wall edges between adjacent rooms. FIG. 10A depicts display 1000 including multiple room floor plans in a larger building, and FIG. 10B depicts another display 1050 including three-dimensional models of multiple rooms in a building.

In addition to use with the system 100, the floor plans, three-dimensional models, photographs, and building structure data are stored in a memory of the mobile electronic device 104 for export to external computing devices. For example, a computer aided design (CAD) program on an external computer receives the data from the system 100 for an architect or designer to view and alter plans for construction and remodeling in the room. Additionally, the mobile device 104 optionally transmits the generated data and models to one or more online data storage services to share the generated model data and to provide access to other computing devices to access the models for further processing.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A method for generating a floor plan of a room comprising:
   receiving with a gesture input device in the mobile electronic device a plurality of strokes corresponding to walls in a room;
   generating with a controller in the mobile electronic device an approximate floor plan of the room with reference to the plurality of strokes;
   receiving with the gesture input device an input gesture that selects one wall in the approximate floor plan for measurement;
   receiving with the controller measurement data from a range finder corresponding to a dimension of the selected one wall;
   modifying with the controller the approximate floor plan with reference to the measurement data from the range finder, the modifying further comprising:
      identifying with the controller an angle between a first stroke corresponding to a first wall in the room and a second stroke corresponding to a second wall in the room that contacts the first wall;
      identifying with the controller a first difference between the identified angle and a first predetermined angle;
      identifying with the controller a second difference between the identified angle and a second predetermined angle;
      adjusting with the controller the identified angle to be the first predetermined angle in the modified floor plan in response to the first difference being smaller than the second difference; and
      adjusting with the controller the identified angle to be the second predetermined angle in the modified floor plan in response to the second difference being smaller than the first difference; and
   generating with a display in the mobile electronic device a graphical display of the modified floor plan of the room.

2. The method of claim 1 wherein the first predetermined angle is a ninety degree angle and the second predetermined angle is one of a forty-five degree or one hundred thirty-five degree angle.

3. The method of claim 1 further comprising:
   identifying with the controller an angle between a first stroke corresponding to a first wall in the room and a second stroke corresponding to a second wall in the room that contacts the first wall;
   identifying with the controller a difference between the angle and each of a plurality of predetermined angles including 45, 90, 135, 180, 225, 270, and 315 degree angles; and
   adjusting with the controller the identified angle to one predetermined angle in the plurality of predetermined angles having a minimum identified difference to the angle.

4. The method of claim 1 further comprising:
   identifying with the controller an intersection between a first stroke and a second stroke corresponding to a first wall and a second wall, respectively, in the approximate floor plan;
   receiving with the controller angular measurement data from an inertial sensor in the mobile electronic device as the mobile electronic device is rotated through an angle of an intersection of the first wall and the second wall from a first position that is substantially parallel with the first wall to a second position that is substantially parallel with the second wall; and
   modifying with the controller the approximate floor plan with an angle between the first wall and the second wall with reference to the angular measurement data.

5. The method of claim 1 further comprising:
   generating with a camera in the mobile electronic device photographic data of the one wall;
   processing with the controller the photographic data to identify a structural feature in the one wall; and
   modifying with the controller the approximate floor plan of the room to include the identified structural feature in the one wall.

6. The method of claim 5, the processing of the photographic data to identify the structural feature further comprising:
   identifying with the controller one of an entry, window, electrical outlet, ventilation outlet, and sprinkler in the photographic data.

7. The method of claim 1 further comprising:
   receiving with the controller measurement data from the range finder corresponding to a height between a floor of the room and a ceiling of the room; and generating with the controller a three dimensional model of the room from the modified floor plan and the measurement data corresponding to the height between the floor and the ceiling.

8. The method of claim 7 further comprising:
generating with a camera in the mobile electronic device photographic data of the one wall;
superimposing with the controller the photographic data of the one wall on a polygon corresponding to the one wall in the three dimensional model of the room; and
generating with a display in the mobile electronic device a graphical display of the three dimensional model of the room including the photographic data superimposed on the one wall.

9. The method of claim 1 further comprising:
receiving with the gesture input device in the mobile electronic device an input gesture identifying a location of a structural feature one of the plurality of walls represented in the modified floor plan; and
combining with the controller the modified floor plan with another modified floor plan corresponding to an adjacent room with the structural feature in the modified floor plan being aligned with a corresponding structural feature in a wall in the other modified floor plan.

10. A system for generating a model of a room comprising:
a range finder; and
a mobile electronic device operatively connected to the range finder, the mobile electronic device comprising:
a display device;
a gesture input device configured to receive input gestures from an operator; and
a controller operatively connected to the display device, the gesture input device, and the range finder, the controller being configured to:
receive with the gesture input device a plurality of strokes corresponding to walls in a room;
generate an approximate floor plan of the room from the plurality of strokes;
receive with the gesture input device an input gesture that selects one wall in the approximate floor plan of the room for measurement;
receive measurement data from the range finder corresponding to a dimension of the one wall;
modify the approximate floor plan of the room with reference to the measurement data from the range finder, the controller being further configured to:
identify an angle between a first stroke corresponding to a first wall in the room and a second stroke corresponding to a second wall in the room that contacts the first wall;
identify a first difference between the identified angle and a first predetermined angle;
identify a second difference between the identified angle and a second predetermined angle;
adjust the identified angle to be the first predetermined angle in the modified floor plan in response to the first difference being smaller than the second difference; and
adjust the identified angle to be the second predetermined angle in the modified floor plan in response to the second difference being smaller than the first difference; and
display the modified floor plan of the room with the display device.

11. The system of claim 10 wherein the first predetermined angle is a ninety degree angle and the second predetermined angle is one of a forty-five degree or one hundred thirty-five degree angle.

12. The system of claim 10, the mobile electronic device further comprising:
an inertial sensor; and
the controller being operatively connected to the inertial sensor and further configured to:
identify an intersection between a first stroke and a second stroke corresponding to a first wall and a second wall, respectively, in the approximate floor plan;
receive angular measurement data from the inertial sensor as the mobile electronic device is rotated through an angle of an intersection of the first wall and the second wall from a first position that is substantially parallel with the first wall to a second position that is substantially parallel with the second wall; and
modify the approximate floor plan with an angle between the first wall and the second wall corresponding to the angular measurement data.

13. The system of claim 10 further comprising:
a camera in the mobile electronic device; and
the controller being operatively connected to the camera and further configured to:
generate photographic data of the one wall with the camera;
process the photographic data to identify a structural feature in the one wall; and
adjust the modified floor plan of the room to include the identified structural feature in the one wall.

14. The system of claim 13, the controller being further configured to:
identify the structural feature as one of an entry, window, electrical outlet, ventilation outlet, and sprinkler in the photographic data.

15. The system of claim 10, the controller being further configured to:
receive measurement data from the range finder corresponding to a height between a floor of the room and a ceiling of the room; and
generate a three dimensional model of the room from the modified floor plan and the measurement data corresponding to the height between the floor and the ceiling.

16. The system of claim 15 further comprising:
a camera in the mobile electronic device; and
the controller being operatively connected to the camera and further configured to:
generate photographic data of the one wall with a camera in the mobile electronic device;
superimpose the photographic data of the one wall on a polygon corresponding to the one wall in the three dimensional model of the room; and
display the three dimensional model of the room including the photographic data superimposed on the one wall with the display device.

17. The system of claim 10, the controller being further configured to:
receive through the gesture input device an input gesture selecting a location of a structural feature of one of the plurality of walls represented in the modified floor plan; and
combine the modified floor plan with another modified floor plan corresponding to an adjacent room with the structural feature in the modified floor plan being aligned with a corresponding structural feature of a wall in the other modified floor plan.

18. The system of claim 10 wherein the range finder is integrated with the mobile electronic device.

* * * * *